(12) United States Patent
Lin et al.

(10) Patent No.: US 7,078,723 B2
(45) Date of Patent: Jul. 18, 2006

(54) MICROELECTRONIC DEVICE WITH DEPTH ADJUSTABLE SILL

(75) Inventors: Chuan-Yi Lin, Tainan (TW);
Wen-Chin Lee, Hsin-Chu (TW);
Sun-Jay Chang, Luye Township (TW);
Shien-Yang Wu, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/819,250

(22) Filed: Apr. 6, 2004

(65) Prior Publication Data

US 2005/0224786 A1    Oct. 13, 2005

(51) Int. Cl.
*H01L 29/06* (2006.01)

(52) U.S. Cl. .......................... 257/19; 257/18; 257/190; 257/191; 257/192

(58) Field of Classification Search ...................... None
See application file for complete search history.

(56) References Cited

U.S. PATENT DOCUMENTS

| | | | | |
|---|---|---|---|---|
| 5,114,871 | A * | 5/1992 | Jones | 438/105 |
| 6,111,267 | A * | 8/2000 | Fischer et al. | 257/19 |
| 6,198,135 | B1 * | 3/2001 | Sonoda | 257/355 |
| 6,319,799 | B1 * | 11/2001 | Ouyang et al. | 438/528 |
| 6,512,252 | B1 * | 1/2003 | Takagi et al. | 257/192 |
| 6,537,894 | B1 * | 3/2003 | Skotnicki et al. | 438/424 |
| 6,541,862 | B1 * | 4/2003 | Amishiro et al. | 257/751 |
| 6,583,000 | B1 * | 6/2003 | Hsu et al. | 438/222 |
| 6,600,170 | B1 * | 7/2003 | Xiang | 257/18 |
| 6,759,695 | B1 * | 7/2004 | Ma et al. | 257/192 |
| 6,781,163 | B1 * | 8/2004 | Takagi et al. | 257/187 |
| 6,815,735 | B1 * | 11/2004 | Inoue et al. | 257/192 |
| 6,858,534 | B1 * | 2/2005 | Mouli | 438/659 |
| 6,900,094 | B1 * | 5/2005 | Hammond et al. | 438/238 |
| 2001/0003364 | A1 * | 6/2001 | Sugawara et al. | 257/192 |
| 2003/0102490 | A1 * | 6/2003 | Kubo et al. | 257/192 |
| 2004/0036118 | A1 * | 2/2004 | Abadeer et al. | 257/347 |
| 2005/0087803 | A1 * | 4/2005 | Hara et al. | 257/347 |

OTHER PUBLICATIONS

Lu, Xiang, et al., "SiGe and SiGeC Surface Alloy Formation Using High-Dose Implantation and Solid Phase Epitaxy", International Conference on Ion Implantation Technology, IEEE, 1997, pp. 686-689.

Nayak, Deepak K., et al., "High-Mobility Strained-Si PMOSFET's", IEEE Transactions on Electron Devices, vol. 43, No. 10, Oct. 1996, pp. 1709-1716.

Selvakumar, C.R., et al., "SiGe-Channel n-MOSFET by Germanium Implantation", IEEE Electron Device Letters, vol. 12, No. 8, Aug. 1991, pp. 444-446.

(Continued)

*Primary Examiner*—Andy Huynh
(74) *Attorney, Agent, or Firm*—Haynes and Boone, LLP (57) ABSTRACT

A microelectronic device includes a substrate, and a patterned feature located over the substrate and a plurality of doped regions, wherein the patterned feature includes at least one electrode. The microelectronic device includes at least one sill region for the enhancement of electron and/or hole mobility.

22 Claims, 5 Drawing Sheets

OTHER PUBLICATIONS

Wu, Y.H., et al., "High Temperature Formed SiGe P-MOSFET's with Good Device Characteristics", IEEE Electron Device Letters, vol. 21, No. 7, Jul. 2000, pp. 350-352.

Yeo, Yee-Chia, et al., "Enhanced Performance in Sub-100 nm CMOSFETs Using Strained Epitaxial Silicon-Germanium", International Electron Devices Meeting (IEDM), Dec. 10-13, 2000, pp. 753-756.

* cited by examiner

MICROELECTRONIC DEVICE WITH DEPTH ADJUSTABLE SILL

CROSS-REFERENCE

This application is related to the following commonly-assigned U.S. Patent Application:

"A STRAINED Si DEVICE MANUFACTURING METHOD," under our Ser. No. 10/937,722 as yet unfiled, having Chien-Chao Huang, Cheng-Kuo Wen, and Fu-Liang Yang named as inventors.

TECHNICAL FIELD

The present disclosure relates generally to microelectronic device and method of manufacturing, and more specifically to a microelectronic device with enhanced electron and/or hole mobility

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having feature sizes (e.g., the smallest component (or line) that may be created using the process) of less than 90 nm. However, the reduction in size of device geometries frequently introduces new challenges that need to be overcome.

As microelectronic devices are scaled below 45 nm, the electrical efficiency and become an issue that impacts device performance. Microelectronic device performance can be significantly affected by the electron and hole mobility in semiconductor materials. For example, advanced microelectronic devices may incorporate strained silicon as the substrate. Strained silicon comprises a plurality of layers to provide a lattice mismatch of silicon atoms and other atoms such as germanium. The lattice mismatch can provide enhanced improvement of the electron and/or hole mobility of the microelectronic device, thus a reduction in the threshold voltage may be required for a field effect transistor on strained silicon. However, the plurality of layers that form the strained silicon may not provide optimal device operation for all microelectronic devices of a semiconductor product. For example, NMOS devices and PMOS devices can have differing electrical characteristics when fabricated on strained silicon. The differences in the electrical characteristics mandate modification of either the NMOS and/or the PMOS device on strained silicon.

Accordingly, what is needed in the art is an integrated circuit device and method of manufacturing the integrated circuit device that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to a microelectronic device and method for fabrication, and more specifically to a microelectronic device with depth adjustable sill. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
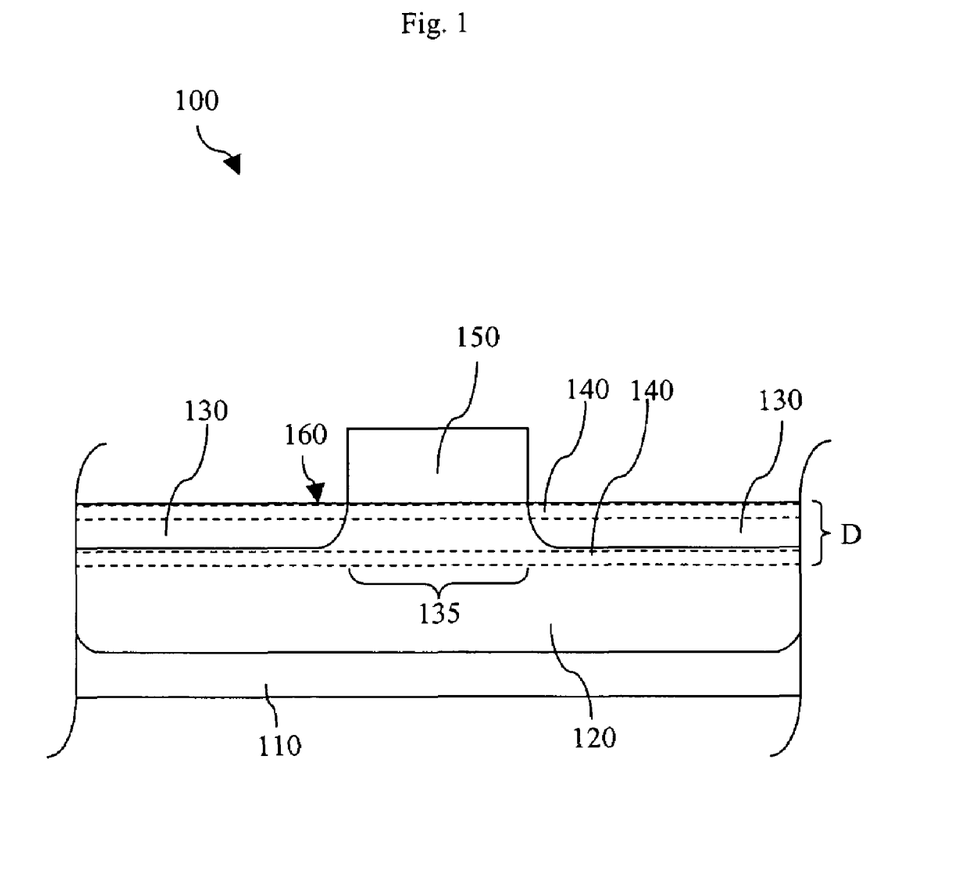
FIG. 1 illustrates a sectional view of one embodiment of a microelectronic device constructed according to aspects of the present disclosure.

Referring to FIG. 1, illustrated is a sectional view of one embodiment of a microelectronic device 100 constructed according to aspects of the present disclosure. The microelectronic device 100 includes a substrate 110, at least one doped region(s) 120, doped source/drain regions 130, at least one depth adjustable sill 140, and an electrode 150. Depth adjustable sill 140 is drawn in dashed lines in two locations in device 100 of FIG. 1 to indicate that sill 140 may be fabricated at different depths D within substrate 110 relative to the surface 160 as will be discussed in more detail below.

The substrate 110 may include a plurality of microelectronic devices 100, wherein one or more layers of a gate structure thereof, or other features contemplated by the microelectronic device 100 within the scope of the present disclosure, may be formed by immersion photolithography, maskless lithography, chemical-vapor deposition (CVD), physical-vapor deposition (PVD), plasma-enhanced chemical vapor deposition (PECVD), atomic layer deposition (ALD) and/or other process techniques. Conventional and/or future-developed lithographic, etching and other processes may be employed to define the microelectronic device 100 from the deposited layer(s). The substrate 110 may be a silicon-on-insulator (SOI) substrate, a polymer-on-silicon, and may comprise silicon, gallium arsenide, gallium nitride, strained silicon, silicon germanium, silicon carbide, carbide, diamond and/or other materials. Alternatively, the substrate 110 may comprise a fully depleted SOI substrate wherein the device active silicon thickness may range between about 200 nm and about 50 nm in one embodiment.

The doped region(s) 120 may be formed in the substrate 110 by ion implantation (although use of a P doped substrate may negate the need for a well region). For example, the doped region(s) 120 may be formed by growing a sacrificial oxide on the substrate 110, opening a pattern for the location of the region(s) 120, and then using a chained-implantation procedure, as is known in the art. It is understood that the substrate 110 may have a P doped well or a combination of P and N wells. The doped region(s) 120, while not limited to any particular dopant types or schemes, in one embodiment, the doped region(s) 120 and/or source/drain regions 130 employ boron as a p-type dopant and deuterium-boron complexes for an n-type dopant. The deuterium-boron complexes may be formed by plasma treatment of boron-doped diamond layers with a deuterium plasma.

In one embodiment, the doped region(s) 120 may be formed using a high density plasma source with a carbon-to-deuterium ratio ranging between about 0.1 percent and about 5 percent in a vacuum process ambient. Boron doping may be provided by the mixing of a boron containing gas with a carbon/hydrogen gas. The boron containing gas may include $B_2H_6$, $B_2D_6$ and/or other boron containing gases. The concentration of boron doping may depend upon the amount of boron containing gas that may be leaked or added into the process. The process ambient pressure may range between 0.1 mTorr and about 500 Torr. The substrate 110 may be held at a temperature ranging between 150° C. and about 1100° C. High density plasma may be produced by a microwave electron cyclotron resonance (ECR) plasma, a helicon plasma, a inductively coupled plasma and/or other high density plasma sources. For example, the ECR plasma may utilize microwave powers ranging between about 800 Watts and about 2500 Watts.

As described above, the doped region(s) 120 may also include n-type deuterium-boron complex regions of the substrate 110, which may be formed by treating the above-described boron-doped regions employing a deuterium plasma. For example, selected areas of the substrate 110 may be covered by photoresist or another type of mask such that exposed boron-doped regions may be treated with the deuterium containing plasma. The deuterium ions may provide termination of dangling bonds, thereby transmuting the p-type boron-doped regions into n-type deuterium-boron complex regions. Alternatively, deuterium may be replaced with tritium, hydrogen and/or other hydrogen containing gases. The concentration of the n-type regions may generally be controlled by a direct current (DC) or a radio frequency (RF) bias of the substrate 110. The above-described processes may also be employed to form lightly-doped source/drain regions 130 in the substrate 110. Of course, other conventional and/or future-developed processes may also or alternatively be employed to form the source/drain regions 130.

The depth adjustable sill 140 is formed by conducting and/or semiconductor material which may provide electron and/or hole mobility enhancement in the microelectronic device 100. The depth adjustable sill 140 may be formed upon and/or within the substrate 110. For example, the depth adjustable sill 140 may be deposited upon the substrate 110 by CVD, PECVD, ALD, PVD, and/or other processes. The depth adjustable sill 140 may also be formed by ion implantation, wherein the sill 140 may be formed within an arbitrary depth of the substrate 110. The depth of the ion implantation may be controlled through the impurity implant energy, which may range between about 1 KeV and about 800 KeV. The impurity concentration may range between about $1 \times 10^{13}$ atoms/cm$^3$ and about $1 \times 10^{19}$ atoms/cm$^3$. The sill 140 may also include a monolayer of the impurity. Alternatively, the sill 140 may include a plurality of different impurity layers. For example, the sill 140 may include a first Ge layer, a second strained SiGe layer, and/or a SiC layer.

In one embodiment, the sill 140 may be formed by plasma source ion implantation (PSII), or also referred to as plasma source ion immersion. PSII may include a process wherein the doped region(s) 120, the doped source/drain regions 130, and/or the electrode 150 may be exposed to a plasma source, while an applied bias may be applied to the substrate 110. The processing tool to perform PSII may include a single and/or batch wafer reactor, wherein a direct current (DC) and/or radio frequency (RF) bias may be applied to the substrate(s) 110. The PSII reactor employs a process ambient pressure that may range between 0.01 mTorr and about 1000 Torr. The substrate 110 may be held at a temperature ranging between 150° C. and about 1100° C. High density plasma may be produced by a microwave electron cyclotron resonance (ECR) plasma, a helicon plasma, a inductively coupled plasma and/or other high density plasma sources. The plasma may comprise Ar, H, N, Xe, $O_2$, As, $B_2H_6$, $GeH_4$, P, and/or other sources of the impurity. For example, the helicon plasma may utilize RF powers ranging between about 200 Watts and about 2500 Watts. The applied bias may range between about ±200 V and about ±5000 V. The application of the bias to the substrate 110 in the plasma creates an extended plasma sheath substantially covering the microelectronic device 100, wherein ions and/or electrons may be accelerated away from the plasma sheath, thereby accelerating the ions of the impurity into the doped region(s) 120, the doped source/drain regions 130, and/or the electrode 150, to form the sill 140.

Of course it is understood, that the location of the depth adjustable sill 140 may include a flat plane of the substrate 110, and/or other configurations such as graded, diagonal, and other configurations. The sill 140 may be located at a depth ranging between about 0 and about 50000 Angstroms from surface 160. The sill 140 may have a thickness ranging between about 2 Angstroms and about 250 Angstroms. The depth adjustable sill 140 may by formed by Ge, SiGe, SiC, C, carbide, strained SiGe, and/or other materials. The sill 140 may be located within the region of the source/drain regions 130, and/or the doped region(s) 120, wherein the channel region 135 may be part of sill 140. In one embodiment, the sill 140 may be located within the channel region 135 to provide electron and/or hole mobility enhancement in NMOS and/or PMOS devices. The sill 140 may be located within a plane level to the source/drain regions 130, and/or may be located proximately below the source/drain regions 130. The sill 140 may also be located within the source/drain regions 130.

In another embodiment, a cap layer or "sill" (not shown) may be located proximate the sill 140. Thus, multiple sill(s) 140 may be incorporated into the substrate 110. For example, a one of the multiple sill(s) 140 may include a cap layer. The cap layer may be formed by Si, strained Si, strained SiGe, SiGe, diamond, carbide, and/or other materials. The cap layer may also be located over the sill 140, and may be located only within the channel region 135, and/or may be located proximate the source/drain regions 130, and the channel region 135.

The electrode 150 may include a stack of material layers which provide electrical activation of at least one function of the microelectronic device 100. For example, the electrode 150 may include multiple layers such as a gate dielectric, a high-k dielectric later, a polysilicon layer, and/or other material layers. Other materials for the electrode 150 may include Ti, Ta, Mo, Co, W, TiN, TaN, WN, MoSi, WSi, CoSi, and/or other materials. The gate dielectric may comprise a $SiO_2$ layer and/or nitrided $SiO_2$. Alternatively, the gate dielectric material may be replaced by the high-k dielectric.

In one embodiment, the high-k layer may be formed from a variety of different materials, such as TaN, TiN, $Ta_2O_5$, $HfO_2$, $ZrO_2$, HfSiON, $HfSi_x$, $HfSi_xN_y$, $HfAlO_2$, $NiSi_x$, or other suitable materials using ALD, CVD, PECVD, evaporation, or other methods. Generally, the high-k layer may have a thickness between approximately 2 and 80 Angstroms. With some materials, such as HfSiON, the high-k layer of the electrode 150 may be blanket deposited on the surface of the substrate 110, while other materials may be selectively deposited. Alternatively, it may be desirable to blanket deposit some materials, including HfSiON, in some fabrication processes, while selectively depositing the same materials in other processes. Since the gate oxide thickness continues to decrease along with device geometries, incorporating such high-k materials may yield the higher capacitance needed to reduce the gate leakage associated with smaller device geometries.

In one embodiment, the substrate 110 may include an air gap to provide insulation for the microelectronic device 100. For example, a "silicon-on-nothing" (SON) structure may be employed wherein microelectronic device 100 includes a thin insulation layer formed by air and/or other insulator. The microelectronic device 100 may include the sill 140 being formed of SiGe with a Si cap layer located over the SiGe sill 140. The SiGe sill 140 may be removed in a subsequent step. The Si cap layer may become a device active region for the microelectronic device 100. The Si cap layer may be located over a gap from by the removal of the SiGe sill 140. The gap may include air and/or other dielectric material.

Of course, the present disclosure is not limited to applications in which the microelectronic device(s) 100 is a gate structure or a transistor, or other semiconductor device. For example, in one embodiment, the microelectronic device 100 may comprise an electrically programmable read only memory (EPROM) cell, an electrically erasable programmable read only memory (EEPROM) cell, a static random access memory (SRAM) cell, a dynamic random access memory (DRAM) cell, a single electron transistor (SET), and/or other microelectronic devices (hereafter collectively referred to as microelectronic devices). The geometric features of the microelectronic device 100 may range between about 1300 Angstroms and about 1 Angstrom in one embodiment.

Figure 2:
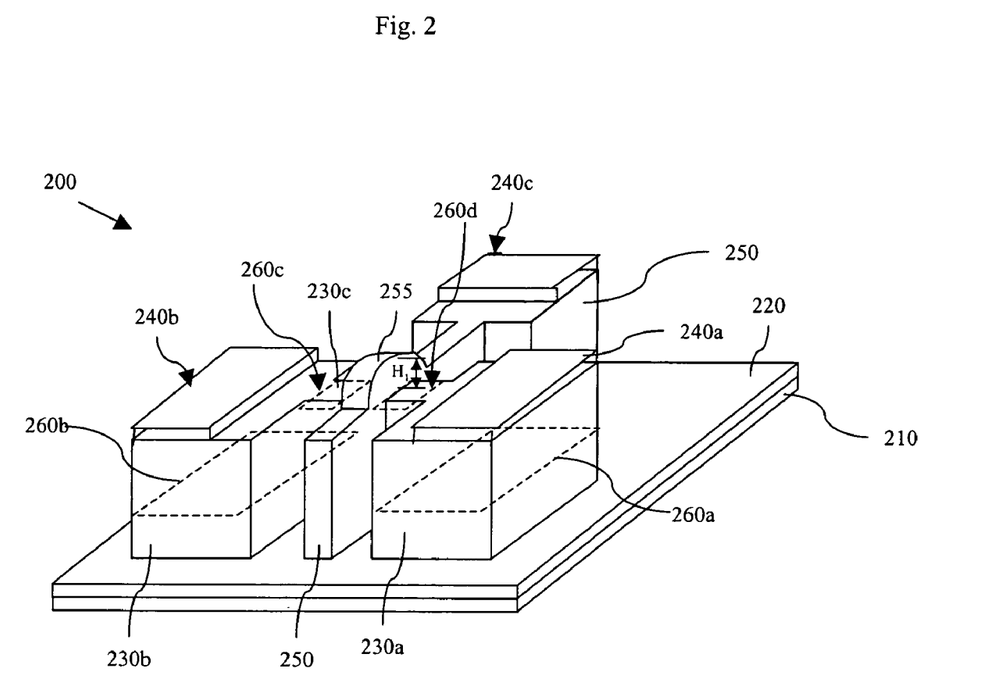
FIG. 2 illustrates a perspective view of one embodiment of a microelectronic device constructed according to aspects of the present disclosure.

Referring to FIG. 2, illustrated is a perspective view of one embodiment of a microelectronic device 200 constructed according to aspects of the present disclosure. In the illustrated embodiment, the microelectronic device 200 is a FinFET. Of course, aspects of the present disclosure are also applicable and/or readily adaptable to any type of transistor, including single-gate transistors, double-gate transistors, triple-gate transistors, and other multiple-gate transistors, and may be employed in a myriad of applications, including sensor cells, memory cells, logic cells and others.

The microelectronic device 200 includes an insulator 220 formed over or integral to a substrate 210. The microelectronic device 200 also includes first and second semiconductor features 230a, 230b. In one embodiment, the semiconductor features 230a, 230b are source/drain regions. The first and second semiconductor features 230a, 230b are connected by a third semiconductor feature 230c. For example, the third semiconductor feature 230c may be a channel region, possibly having a dopant type opposite a dopant type of the first and second semiconductor features 230a, 230b.

The microelectronic device 200 also includes a plurality of sills 260a–d. The sills 260a–d may be formed of Ge, SiGe, SiC, carbide, strained SiGe, and/or other materials. The sills 260a, 260b may be located within the region of the source/drain regions 230a, 230b and/or the sills 260c, 260d may be located within the channel region 230c. Alternatively, the sills 260a, 260b may include a plurality of layers wherein there may be a germanium implant layer followed by a cap layer. The cap layer may comprise Si, SiGe, strained Si, strained SiGe, diamond, carbide, and/or other materials.

The microelectronic device 200 further includes first and second contacts 240a, 240b formed over corresponding ones of the source/drain regions 230a, 230b. The first and second contacts 240a, 240b may comprise Ti, Ta, Mo, Ni, TiN, TaN, CoSi, TiSi, TaSi, MoSi, NiSi, and/or other conductive materials.

The microelectronic device 200 may also include a biasing feature 250 interposing the first and second source/drain regions 230a, 230b and spanning the third source/drain regions 230c. In one embodiment, the biasing feature 250 may be a transistor gate. For example, the biasing feature 250 may comprise doped polysilicon and/or other conductive materials such as Ti, Ta, Mo, TiN, TaN, MoSi, NiSi, and CoSi. The biasing feature 250 in the illustrated embodiment extends from at least partially between the first and second source/drain regions 230a, 230b, subsequently widening and terminating at a third contact 240c, which is substantially similar to the first and second contacts 240a, 240b. Moreover, as shown in FIG. 2, the biasing feature 250 may include a boss, wedge, fin or other type of protrusion 255 extending away from the source/drain regions 230a–c. For example, the protrusion 255 may extend to a height $H_1$ over the source/drain regions 230a–c. The microelectronic device 200 may also include a dielectric layer interposing the biasing feature 250 from one or more of the semiconductor features 230a–c.

Figure 3:
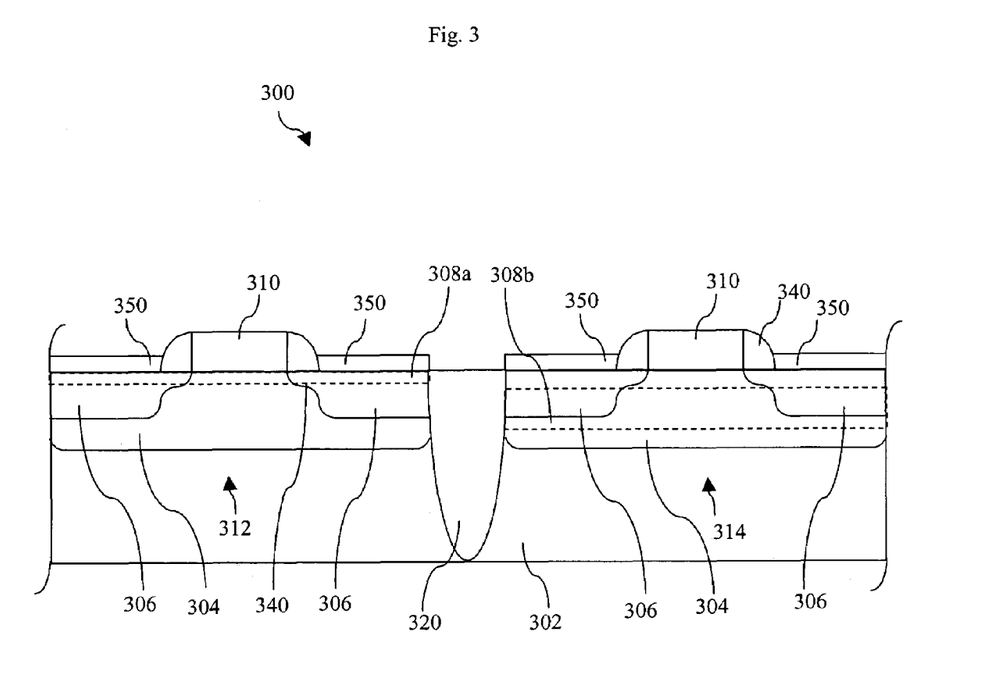
FIG. 3 illustrates a sectional view of another embodiment of microelectronic device constructed according to aspects of the present disclosure.

Referring to FIG. 3, illustrated is a sectional view of one embodiment of depth adjustable sill microelectronic device 300 constructed according to aspects of the present disclosure. The microelectronic device 300 includes the substrate 302, an isolation region 320, and at least one microelectronic device(s) 312 and 314.

The isolation 320 comprises a region for electrical isolation of the device(s) 312 and 314. The isolation region 320 may include a trench filled with a dielectric material, such as shallow trench isolation. Alternatively, isolation region 320 may include an air gap. The isolation 320 dielectric material may be a low-k dielectric material, and/or may include $SiO_2$, SiN, SiC, and/or other materials.

Microelectronic device(s) 312, 314 are PMOS and/or NMOS devices. For example the device 310 may be a PMOS device wherein the sill 308a may be located proximately below the electrode 310. The device 312 may also include the cap layer comprising Si, SiGe, strained Si, strained SiGe, SiC, diamond, carbide, and/or other materials. The location of the sill 308a proximate the electrode 310 provides for enhancement of electron mobility. The device 314 may comprise a NMOS device wherein the sill 308b may be located proximately below and/or within the source/drain regions 306. The device 314 may also include the cap layer comprising Si, SiGe, strained Si, strained SiGe, SiC, diamond, carbide, and/or other materials. The location of the sill 308b proximate the source/drain regions 306 provides for enhancement of hole mobility. The device(s) 312, 314 may further include spacers 340 and contacts 350. The spacers 340 may be disposable or non-disposable. The spacers 340 may be comprised of $SiO_2$, SiN, polymer, and/or other materials. The contacts 350 comprise CoSi, TiSi, TaSi, MoSi, NiSi, and/or other conductive materials.

Figure 4:
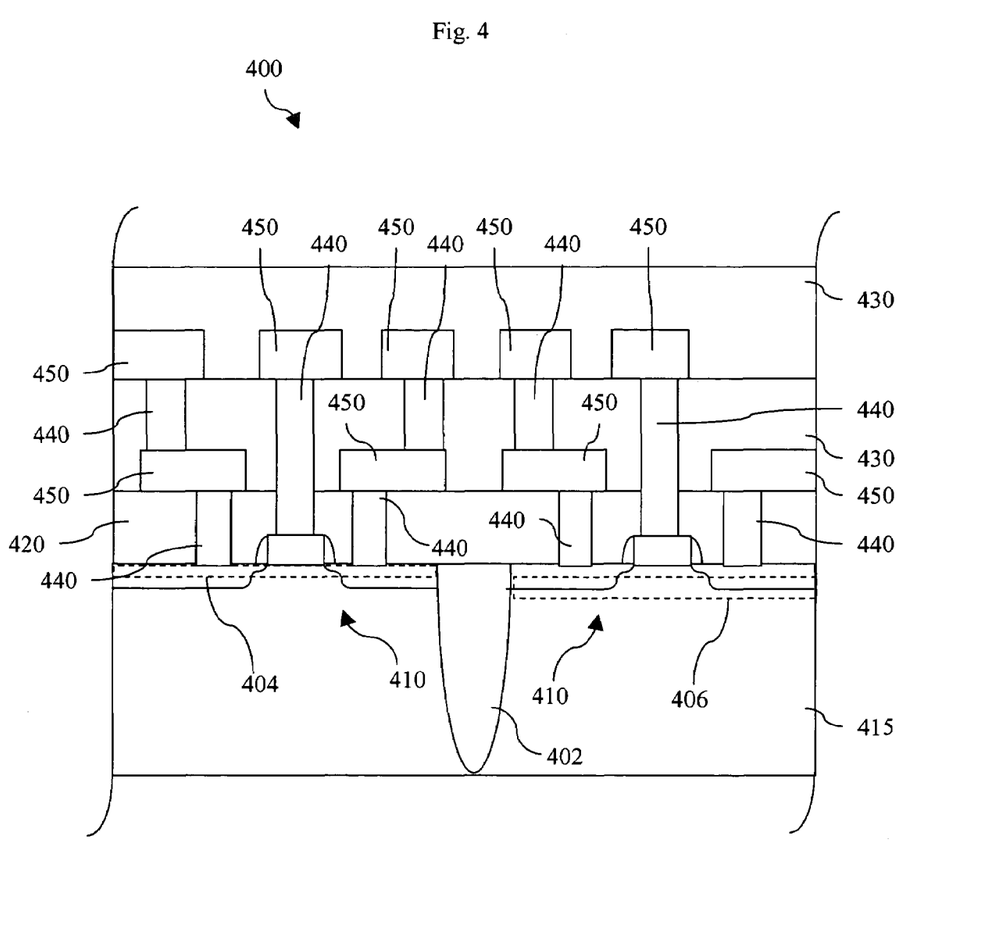
FIG. 4 illustrates a sectional view of one embodiment of an integrated circuit constructed according to aspects of the present disclosure.

Referring to FIG. 4, illustrated is a sectional view of one embodiment of an integrated circuit device 400 constructed according to aspects of the present disclosure. The integrated circuit device 400 is one environment in which the microelectronic device(s) 100 and/or 300 may be implemented. For example, the integrated circuit device 400 includes a plurality of microelectronic devices 100, wherein one or more of the microelectronic devices 100 may be substantially similar.

The integrated circuit device 400 also includes one or more sill(s) 404–406, one or more insulating layers 420, 430 located over the microelectronic devices 100. The first insulating layer 420, which may itself include multiple insulating layers, may be planarized to provide a substantially planar surface over the plurality of microelectronic devices 100.

The integrated circuit device 400 also includes vertical interconnects 440, such as conventional vias or contacts, and horizontal interconnects 450 (all spatial references herein are for the purpose of example only and are not meant to limit the disclosure). The interconnects 440 may extend through one or more of the insulating layers 420, 430, and the interconnects 450 may extend along one of the insulating layers 420, 430 or a trench formed therein. In one embodiment, one or more of the interconnects 440, 450 may have a dual-damascene structure. The interconnects 440, 450 may be formed by etching or otherwise patterning the insulating layers 420, 430 and subsequently filling the pattern with refractive and/or conductive material, such as tantalum nitride, copper and aluminum.

Figure 5:
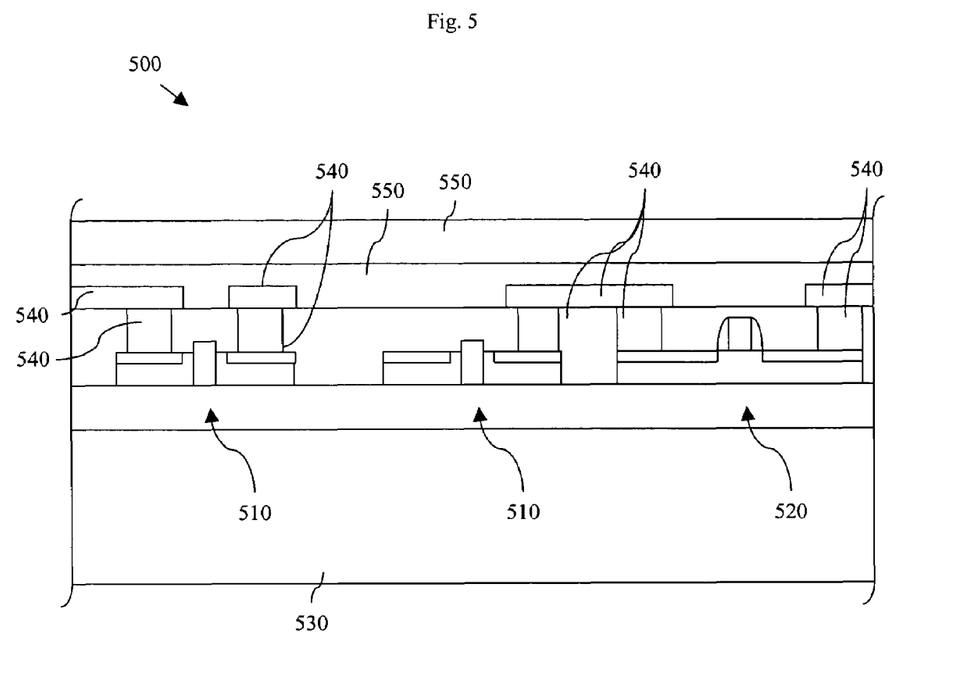
FIG. 5 illustrates a sectional view of another embodiment of an integrated circuit device constructed according to aspects of the present disclosure.

Referring to FIG. 5, illustrated is a sectional view of one embodiment of an integrated circuit device 500 constructed according to aspects of the present disclosure. The integrated circuit device 500 is one environment in which aspects of the above-described microelectronic devices may be implemented. For example, the integrated circuit device 500 includes a plurality of microelectronic devices 510 located on or in a substrate 530, one or more of which is substantially similar to one or more of the microelectronic devices 100, 200, 300 shown in FIGS. 1–3, respectively. The microelectronic devices 510 may be interconnected and/or connected to one or more other microelectronic devices 520 manufactured on or in the substrate 530. The microelectronic devices 520 may be or include metal-oxide-semiconductor field-effect-transistor (MOSFET), FinFETs and/or other conventional or future-developed semiconductor devices.

The integrated circuit device 500 also includes interconnects 540 extending along and/or through one or more dielectric layers 550 to ones of the plurality of microelectronic devices 510. The dielectric layers 550 may comprise silicon dioxide, Black Diamond® (a product of Applied Materials of Santa Clara, Calif.) and/or other materials, and may be formed by CVD, ALD, PVD, spin-on coating and/or other processes. The dielectric layers 550 may have a thickness ranging between about 2,000 Angstroms and about 15,000 Angstroms. The interconnects 540 may include copper, tungsten, gold, aluminum, carbon nano-tubes, carbon fullerenes, a refractory metals and/or other materials, and may be formed by CVD, ALD, PVD and/or other processes.

It is understood, that the present disclosure contemplates the crystalline perturbation of the microelectronic device 100, 200, 300, more specifically, the crystalline perturbation of the substrate 530 and/or a proximate region of the microelectronic device(s) 100, 200, 300. The present disclosure may be utilized to provide balancing of electrical characteristics and/or the crystalline stress of a plurality of microelectronic device(s) of the integrated circuit 400, 500. For example, predetermined areas of the substrate 530 may have openings through a mask (not shown) wherein the sill 140, 260c–d may be located. Therefore, at least one microelectronic device 100, 200, 300 may have sill 140, 260c–d while other device(s) 100, 200, 300 may not have sill 140, 260c–d. Alternatively, the impurity concentration of the sill 140, 260c–d may be different for a plurality of device(s) 100, 200, 300. Thus, the control of the variation of the sill 140, 260c–d properties provides balancing of electrical properties and/or the crystalline stress of a predetermined population of microelectronic device(s) 100, 200, 300 of the integrated circuit 400, 500.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A microelectronic device, comprising:
   a substrate;
   a plurality of doped regions forming drain regions and source regions;
   a first and second patterned feature located over the substrate, each patterned feature including at least one electrode positioned between a drain region and a source region, wherein the first and second patterned features are substantially the same distance from the substrate; and
   a first sill including at least one monolayer of an impurity, the first sill positioned below the drain and source regions of the first patterned feature and separated from the drain and source regions by a first cap layer underlying the first patterned feature; and
   a second sill including at least one monolayer of an impurity, the second sill positioned below the drain and source regions of the second patterned feature and separated from the second patterned feature by a second cap layer underlying the second patterned feature, wherein an interface between the second sill and the second cap layer divides each of the drain and source regions of the second patterned feature into an upper portion and a lower portion.

2. The microelectronic device of claim 1 wherein the substrate comprises diamond.

3. The microelectronic device of claim 1 wherein the substrate comprises strained silicon.

4. The microelectronic device of claim 1 wherein the impurity comprises germanium.

5. The microelectronic device of claim 1 wherein the impurity is ion implanted with an energy ranging between about 1 KeV and about 800 KeV.

6. The microelectronic device of claim 1 wherein the impurity concentration ranges between about $1 \times 10^{13}$ atoms/cm$^3$ and about $1 \times 10^{19}$ atoms/cm$^3$.

7. The microelectronic device of claim 1 wherein the first sill comprises silicon germanium.

8. The microelectronic device of claim 1 wherein the second sill comprises silicon.

9. The microelectronic device of claim 1 wherein the second sill comprises strained silicon.

10. The microelectronic device of claim 1 wherein the second sill comprises diamond.

11. The microelectronic device of claim 1 wherein each of the first and second patterned features comprises a field effect transistor (FET).

12. The microelectronic device of claim 1 wherein an upper surface of the first and second cap layers are an equal vertical distance from the substrate.

13. The microelectronic device of claim 1 wherein the first and second sills are of substantially the same thickness, and wherein the first cap layer is thicker than the second cap layer.

14. The microelectronic device of claim 1 wherein the first sill is thinner than the second sill layer and wherein the first cap layer is thicker than the second cap layer.

15. A semiconductor structure comprising:
a substrate;
a first field effect transistor (FET) including:
   a first SiGe layer formed on the substrate;
   a first Si cap layer formed on the first SiGe layer, wherein the first Si cap layer contains source and drain regions of the first FET and a lower portion of the first Si cap layer is positioned between the source and drain regions and the first SiGe layer; and
   a gate stack formed on the first Si cap layer between the source and drain regions; and
a second FET separated from the first FET by an isolation structure, the second FET including:
   a second SiGe layer formed on the substrate;
   a second Si cap layer formed on the second SiGe layer, wherein an interface between the second Si cap layer and the second SiGe layer divides each of a source region and a drain region of the second FET into upper and lower portions with the upper portions contained within the second Si cap layer and the lower portions contained within the second SiGe layer; and
   a gate stack formed on the second Si cap layer between the source and drain regions.

16. The semiconductor structure of claim 15 wherein the first FET is an NMOS and the second FET is a PMOS.

17. The semiconductor structure of claim 15 wherein the at least one of the first and second SiGe layers is a graded SiGe layer that has a higher concentration of Ge at an interface with the first or second Si cap layer than at an interface with the substrate.

18. The semiconductor structure of claim 15 wherein at least one of the first and second SiGe layers further comprises carbon.

19. The semiconductor structure of claim 15 wherein a lower surface of each of the first and second SiGe layers are an equal distance from the substrate.

20. The semiconductor structure of claim 15 wherein an upper surface of the first and second Si cap layers are an equal vertical distance from the substrate.

21. The semiconductor structure of claim 15 wherein the first and second SiGe layers are of substantially the same thickness, and wherein the first Si cap layer is thicker than the second Si cap layer.

22. The semiconductor structure of claim 15 wherein the first SiGe layer is thinner than the second SiGe layer and wherein the first Si cap layer is thicker than the second Si cap layer.

* * * * *